United States Patent [19]

Suzuki

[11] Patent Number: 4,876,724

[45] Date of Patent: Oct. 24, 1989

[54] PERSONAL SOUND SYSTEM

[75] Inventor: Osami Suzuki, Glenrock, N.J.

[73] Assignee: Toshiba America, Inc., Wayne, N.J.

[21] Appl. No.: 188,221

[22] Filed: Apr. 29, 1988

[51] Int. Cl.$^4$ .................... H04R 1/02; A41D 1/02; A41D 27/20; H04M 1/05

[52] U.S. Cl. .................................. 381/187; 2/94; 2/250; 2/DIG. 6; 381/24; 455/89; 455/90

[58] Field of Search ................. 381/187, 188, 205, 24; 455/89, 90; 2/94–101, DIG. 6, 250–251

[56] References Cited

U.S. PATENT DOCUMENTS

| | | | |
|---|---|---|---|
| D. 268,675 | 4/1983 | Hass | D14/68 |
| 1,486,676 | 3/1924 | Nilssen | 2/94 |
| 1,630,028 | 5/1927 | Reynolds | 381/187 |
| 2,156,504 | 5/1939 | Liss | 381/68 |
| 2,285,083 | 6/1942 | Cover, Sr. | 455/89 |
| 2,314,226 | 3/1943 | Lee | 2/94 |
| 2,372,971 | 4/1945 | Moore | 224/205 |
| 2,571,514 | 10/1951 | Andrews | 381/187 |
| 2,676,738 | 4/1954 | Herrick | 381/69.2 |
| 3,114,105 | 12/1963 | Neumiller | 455/89 |
| 3,501,616 | 3/1970 | Arron | 219/211 |
| 3,868,573 | 2/1975 | Holcomb et al. | 455/89 |
| 4,041,394 | 8/1977 | Pate | 455/100 |
| 4,070,553 | 1/1978 | Hass | 381/24 |
| 4,084,139 | 4/1978 | Jakobe | 455/343 |
| 4,087,864 | 5/1978 | LaBove et al. | 2/102 |
| 4,322,585 | 3/1982 | Liautaud | 381/187 |
| 4,328,533 | 6/1982 | Paredes | 362/108 |
| 4,412,106 | 10/1983 | Pavel | 455/89 |
| 4,485,276 | 11/1984 | Sato | 381/187 |
| 4,539,700 | 9/1985 | Sato | 381/90 |
| 4,589,134 | 5/1986 | Waldron | 381/24 |
| 4,637,075 | 1/1987 | Ingrisano et al. | 2/94 |

FOREIGN PATENT DOCUMENTS

| | | |
|---|---|---|
| 9116 | 4/1980 | European Pat. Off. |
| 41-23684 | 12/1966 | Japan . |
| 56-111396 | 9/1981 | Japan ................ 381/187 |
| 56-151310 | 11/1981 | Japan . |
| 57-41374 | 3/1982 | Japan . |
| 57-41387 | 3/1982 | Japan . |

(List continued on next page.)

OTHER PUBLICATIONS

Wall Street Journal article, Jan. 11, 1988, "Consumer Electronics May Lack Blockbuster, but Not New Gadgets-Your Money Matters" by J. A. Tannenbaum.
Crain's Chicago Business article, Feb. 6, 1984, p. 37, "After Hours Inventor Listening Again for Sounds of Success", by Sandra Pesmen.
Philadelphia Inquirer article, Jan. 20, 1984, Section C, "A Vest Brings Music to Your Ears" by Sue Chastain.
Pioneer "Sound Warp" Publication.
Wireless World, May 1941, "RCA Report", pg. 137.
Maurice Buchbinder, "A Mental Telegraf", Radio News, Jun., 1921, pp. 864, 929.
Stereo Safe and Sound TM literature, May 30, 1987, Sports Electronics, Inc.

Primary Examiner—Jin F. Ng
Assistant Examiner—Danita R. Byrd
Attorney, Agent, or Firm—Finnegan, Henderson, Farabow, Garrett & Dunner

[57] ABSTRACT

A personal sound system comprising a garment adapted to substantially cover a person's upper torso, a first pocket for removably supporting a first speaker on the garment in the vicinity of a person's left shoulder, a second pocket for removably supporting a second speaker on the garment in the vicinity of the person's right shoulder, a third pocket for removably supporting an electrical signal producing device on the garment and an elongated flap extended from the third pocket to the second pocket and through that portion of the garment encircling the person's neck and to the first pocket for removably supporting flexible wires on the garment, which wires are adapted to interconnect speakers located in the first and second pockets, and an electrical signal producing device located in the third pocket, while permitting those wires to be readily removed from the garment when the garment is to be cleaned. Preferably, the flap is located on the interior surface of the jacket. In the alternative, the flap may be replaced by an elongated pocket located on the exterior surface of the garment which pocket is closable by an elongated zipper.

13 Claims, 6 Drawing Sheets

FOREIGN PATENT DOCUMENTS

| | | |
|---|---|---|
| 57-204779 | 12/1982 | Japan . |
| 58-154937 | 9/1983 | Japan .................................... 455/89 |
| 59-48179 | 3/1984 | Japan . |
| 59-48180 | 3/1984 | Japan . |
| 59-48181 | 3/1984 | Japan . |
| 59-117611 | 8/1984 | Japan . |
| 59-117612 | 8/1984 | Japan . |
| 59-117613 | 8/1984 | Japan . |
| 59-159088 | 10/1984 | Japan . |
| 59-166580 | 11/1984 | Japan . |
| 60-19290 | 2/1985 | Japan . |
| 60-29116 | 2/1985 | Japan . |
| 60-98990 | 5/1985 | Japan . |
| 60-139096 | 7/1985 | Japan ................................... 381/188 |
| 1098553 | 1/1986 | United Kingdom . |
| 2160759 | 1/1986 | United Kingdom ................... 381/88 |

# PERSONAL SOUND SYSTEM

FIELD OF THE INVENTION

The present invention relates to a personal sound system and more particularly to a personal stereophonic sound system particularly suited for use while engaging in various activities.

BACKGROUND INFORMATION

In recent years, personal sound systems have been marketed for use by people engaged in various outdoor activities such as jogging, hiking, skiing, bicycling and the like. One such personal sound system is disclosed in U.S. Pat. No. 4,589,134 issued to Waldron, the contents of which is expressly herein incorporated by reference. The Waldron patent discloses a personal sound system which includes a garment having a pocket located adjacent each shoulder for receiving a pair of speakers and a third pocket for carrying a sound signal-producing device. Wires having connectors at opposite ends are sewn into the garment and are releasably connected to the speakers and signal-producing device to permit the speakers and signal-producing device to be readily removed for cleaning of the garment.

While the Waldron system functions satisfactorily for its intended purpose, there is a demand for a personal sound system which permits the wires of the system to be also readily removable for cleaning of the garment.

OBJECTS OF THE INVENTION

A primary object of the present invention is to provide a personal sound system particularly suited for ready removal of all electronic components from a carrying garment to permit cleaning of that garment.

Additional objects and advantages of the invention will be set forth in the description which follows and in part will be obvious from that description or may be learned by practice of the invention.

SUMMARY OF THE INVENTION

To achieve the foregoing objects and in accordance with the purposes of the invention as embodied and broadly described herein, a personal sound system is provided which comprises a garment adapted to substantially cover a person's upper torso, the garment having portions encircling the person's neck and depending forwardly and rearwardly from the person's right and left shoulders; a first pocket for removably supporting a first speaker on the garment in the vicinity one of the person's shoulders; a second pocket for removably supporting a second speaker on the garment in the vicinity of the person's other shoulder; a third pocket for removably supporting an electrical signal producing device on said garment; and fourth means for removably supporting flexible wires on the garment, which wires are adapted to removably connect between the third pocket and the first and second pockets to permit transmission of the electrical signal from the electrical signal producing device over the wires to the first and second speakers over the wires, and to permit removal of the wires from the garment when the garment is to be cleaned. Preferably, this fourth means comprises an elongated pocket extending from the third pocket to the second pocket, and through that portion of the garment encircling the person's neck to the first pocket. In this embodiment the fourth means preferably includes a zipper for selectively closing the pocket and the pocket preferably opens to the exterior of the garment.

In an alternative preferred embodiment the fourth means comprises a flap extending from the third pocket to the second pocket and through that portion of the garment encircling the person's neck to the first pocket. In this embodiment the fourth means preferably includes hook and loop fasteners for closing the flap over the wires, although in the alternative the fourth means may include snaps for closing the flap over the wires. In any event, the flap in this embodiment preferably opens to the interior of the garment.

It is further preferable that the third pocket include a first closable opening sufficiently large to permit insertion of the electrical signal producing device and a second closable opening, orthogonally oriented with regard to the first opening, and sufficiently large to permit access to controls of the electrical signal producing device, thereby permitting selective access to the device by either the first or second openings.

It is still further preferable that the system of the subject invention include a closable pocket located on that portion of the garment depending rearwardly from the person's right and left shoulders adjacent the person's waist, which pocket is accessible from the exterior of the garment.

DESCRIPTION OF THE PREFERRED EMBODIMENT

Reference will now be made in detail to the present preferred embodiment of the subject invention as illustrated in the accompanying drawings.

Figure 1:
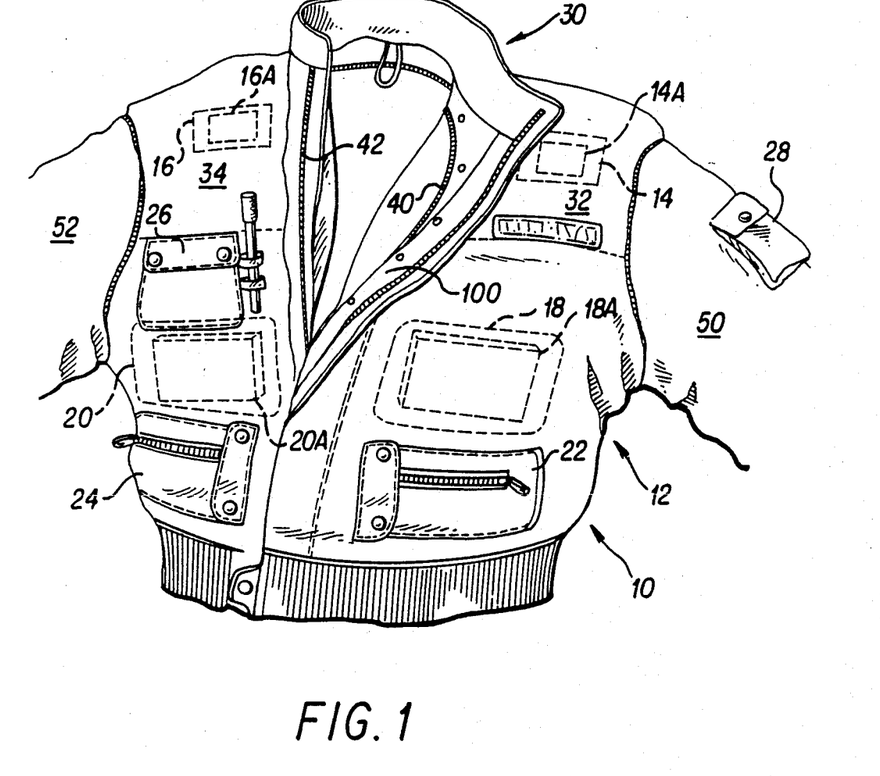
FIG. 1 is a front view of a personal sound system incorporating the teachings of the present invention.
Figure 2:
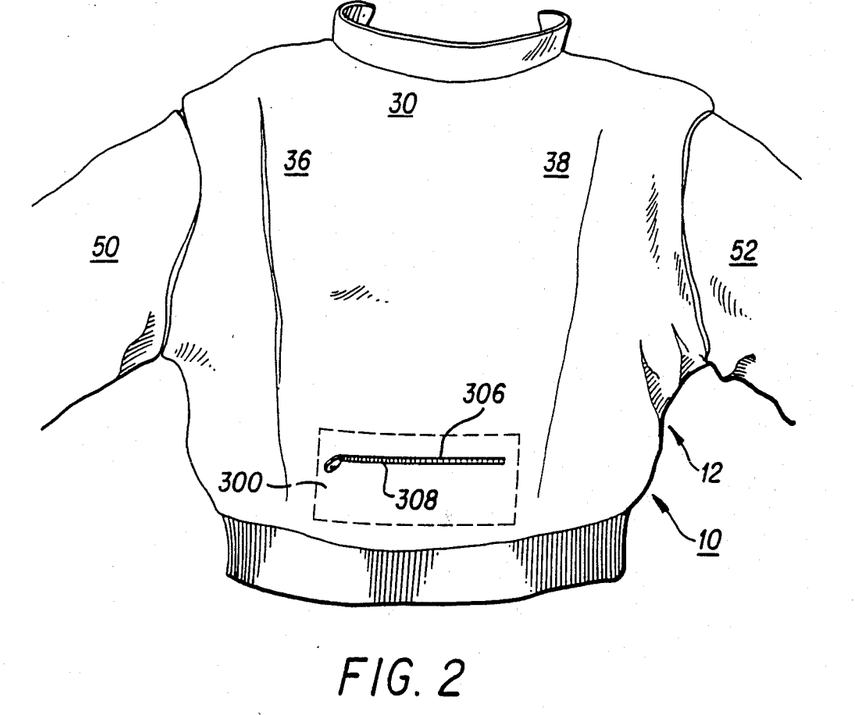
FIG. 2 is a rear view of the personal sound system illustrated in FIG. 1.

A preferred embodiment of a personal sound system 10 is illustrated in FIGS. 1 and 2 as comprising a garment 12, interior pockets 14, 16, 18 and 20 and exterior pockets 22, 24, 26, 28 and 300, each of which will be described in more detail below. Garment 12 is illustrated in FIGS. 1 and 2 as being adopted to substantially cover a person's upper torso. In this regard, garment 12 has a portion 30 which generally encircles a person's neck, portions 32 and 34 which depend forwardly from the person's left and right shoulders respectively, and portions 36 and 38 which depend rearwardly from the person's left and right shoulders, respectively. Portions 32 and 34 have respective zipper sections 40 and 42 which permit sections 32 and 34 to be closed about a person's chest and stomach in a standard fashion. Zipper sections 40 and 42 may, of course, be replaced with any other suitable fastening means such as stripes of respective interacting hook and loop fasteners such as those commonly sold under the trademark "VELCRO" fasteners.

As is further illustrated in FIGS. 1 and 2, garment 12 includes sleeve portions 50 and 52 which are preferably removable from the remaining portions of garment 12 in a manner as is well known to those skilled in the art.

Sound system 10 is specifically designed to incorporate a stereophonic sound system. To this end, interior pockets 14 and 16 are located in the portions 32 and 34 of garment 12 which depend across the front of the person's clavicles between the chest and the shoulder. It should be understood that pockets 14 and 16 may, in the alternative, be located beneath the ear of the wearer of jacket 12 in the proximity of the person's neck and shoulders.

Pockets 18 and 20 are located in the lower chest level areas of portions 34 and 32, respectively. Pockets 14 and 16 are designed each to receive a full wave speaker 14a and 16a, respectively, whereas pockets 18 and 20 are designed each to receive a bass range speaker 18a and 20a, respectively. Speakers 14a, 16a, 18a and 20a together permit a balanced full spectrum stereophonic sound reproduction.

Figures 3, 7, 8:
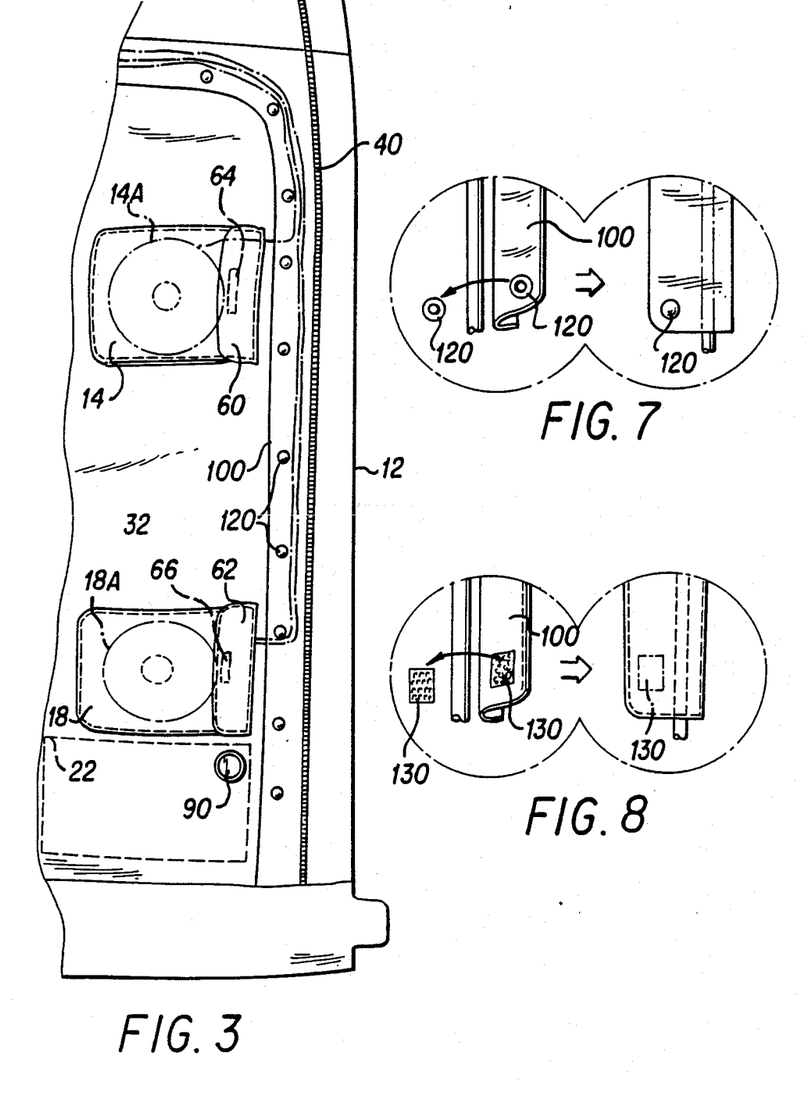
FIG. 3 is a view of the interior surface of a portion of the personal sound system illustrated in FIGS. 1 and 2.
FIG. 7 is a close-up view of a portion of a flap illustrated in FIG. 3.
FIG. 8 is a close-up of an alternate embodiment of the flap illustrated in FIG. 7.

The preferred configuration of pockets 14, 16, 18 and 20 is illustrated by pockets 14 and 18 in FIG. 3. FIG. 3 provides a view of the interior surface of left portion 32 of garment 12. Pockets 14 and 18 are preferably located on the interior surface of portion 32 of garment 12 as shown in FIG. 3. Pockets 14 and 18 are preferably constructed of fabric and have openings on the ends thereof which face zipper 40 and which are closable through operation of flaps 60 and 62, respectively. Flaps 60 and 62 may be held in a closed position through operation of hook and loop fasters 64 and 66, respectively. Pockets 16 and 20 may, of course, be similarly constructed on the interior surface of right hand portion 34. In view of the foregoing, pockets 14, 16, 18 and 20 each provide a mechanism for removeably supporting a corresponding speaker on garment 12, with pocket 14 being in the vicinity of a person's left shoulder, pocket 16 being in the vicinity of a person's right shoulder, pocket 18 being in the vicinity of the left hand side of a person's chest and pocket 20 being in the vicinity of the right hand side of a person's chest.

Pockets 22, 24 and 26 are located on the exterior surface of garment 12, with pocket 22 being located in a lower section of portion 32, pocket 24 being located in a lower section of portion 34, and pocket 26 being located in the chest section of portion 34. Two of pockets 22, 24 and 26 are preferably adapted for supporting an electrical signal producing device on garment 12, while the third of pockets 22, 23 and 24 is preferably adapted for supporting a power source for operation of that electrical signal producing device. For example, pocket 22 may be adapted for supporting a tape player, pocket 26 may be adapted for supporting an amplifier, and pocket 24 may be adapted for supporting a battery pack which provides power to the tape player supported in pocket 22 and the amplifier supported in pocket 26. The precise positioning of the electrical signal producing devices and power supply is, however, irrelevant to the fundamental teachings of the subject invention, it being sufficient that pockets 22, 24 and 26 are designed to support such electrical signal producing devices and that the garment be provided with some mechanism, one of the three pockets or otherwise, for supporting a power supply to drive the electrical signal producing devices. In any event, all of pockets 22, 24 and 26 are preferably closable either through operation of snaps, zippers, hook and loop fasteners or the like.

As illustrated in FIG. 1, pockets 22 and 24 each include a first closable opening sufficiently large to permit insertion of an electrical signal producing device and a second closable opening sufficiently large to permit access to controls of that electrical signal producing device. For example, as illustrated in more detail in connection with FIGS. 4 and 5, pocket 22 includes a first opening 70 along the upper portion of pocket 22. Opening 70 is closable through operation of a standard zipper 72 or other similar fastener. Opening 70 is sufficiently large to permit access to controls 74 of an electrical signal producing device such as a tape player 22A which is located within pocket 22.

Figure 5:
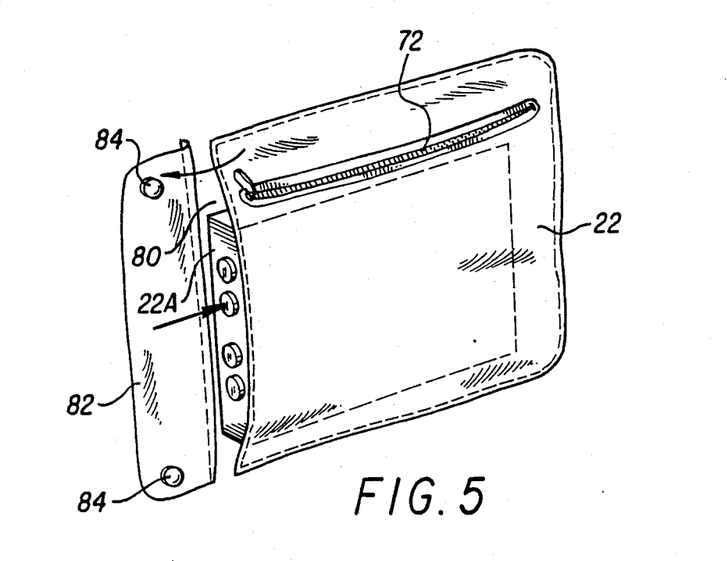
FIG. 5 is a second illustration of the pocket of FIG. 4.

Pocket 22, as illustrated in FIG. 5 also includes a second opening 80 which is closable through operation of a flap 82 containing snaps 84. Pocket 80 is sufficiently large to permit insertion of tape player 22A into pocket 24. Opening 80 is orthogonally oriented with regard to opening 70.

Figure 4:
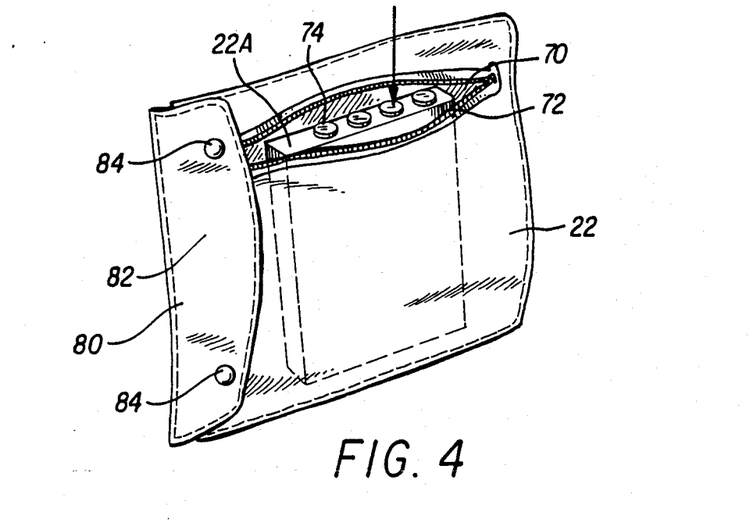
FIG. 4 illustrates a pocket of the system of FIGS. 1 and 2.

The combined operation of pockets 70 and 80 permit an electrical signal producing device, such as tape player 22A to be readily inserted into pocket 22 as is illustrated in FIG. 5 and to also have the controls of such device readily accessible as is illustrated in FIG. 4. The flexibility of two orthogonally oriented openings in pocket 22 permit ready access to the controls 74 of player 22A regardless of whether those controls are basically located at the top of player 22A as illustrated in FIG. 4 or at the side of player 22A as illustrated in FIG. 5.

Figure 6:
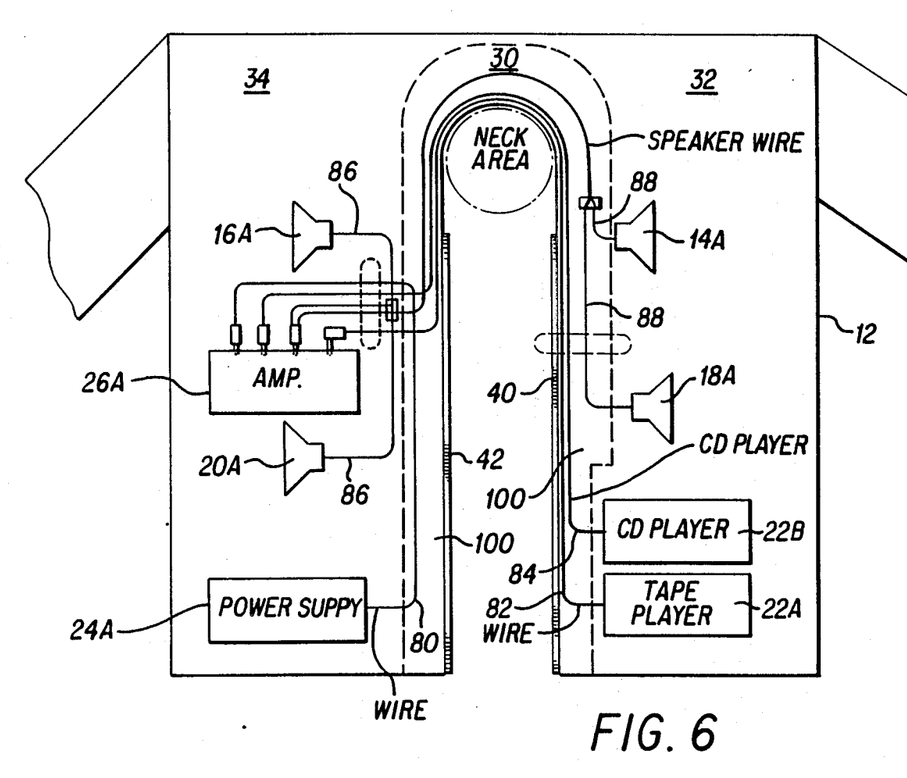
FIG. 6 is a block diagram of a personal sound system incorporating the teachings of the present invention.

The electrical devices to be inserted in pockets 22, 24 and 26 may, for example, comprise devices as shown in FIG. 6, such as tape player 22A and/or CD player 22B, power supply 24A, and amplifier 26A. In one arrangement, tape player 22A may be located in pocket 22, power supply 24A in pocket 24, and amplifer 26A located in pocket 26. Obviously, different arrangements are possible. For example, CD player 22B may replace tape player 22A in pocket 22.

As is also shown in the schematic of FIG. 6, speaker 14A is located in pocket 14, speaker 16A is located in pocket 16, speaker 18A is located in pocket 18 and speaker 20A is located in pocket 20.

A plurality of wires are provided, as shown in FIG. 6, to interconnect power supply 24A, electrical signal producing devices 22A and 22B, and speakers 14A, 16A, 18A and 20A supported on garment 12. For example, power supply wire 80 interconnects power supply 24A and amplifier 26A. Tape player wire 82 interconnects tape player 22A and amplifier 26A. In the alternative, CD player wire 84 interconnects CD player 22B and amplifier 26A. Speaker wires 86 interconnect speaker 16A and 20A with amplifier 26A while speaker wires 88 interconnect speakers 14A and 18A with amplifier 26A. Wires 80, 82, 84, 86 and 88 all include standard connectors at their ends to permit ready connection and disconnection to the corresponding electrical devices at the ends of those wires. For example, each of the illustrated wires may have a standard plug at the end thereof designed to be inserted into a corresponding standard electrical receptacle on the electrical device to which the wire is connected.

Wire 82 from tape player 22A and pocket 22 preferably passes from the interior of pocket 22 through opening 90 (illustrated in FIG. 3) to the interior of garment 12. A similar opening in the interior of pocket 24 permits wire 80 to pass from the interior of garment 12 to power supply 24A located in the interior of pocket 24. A similar opening in the interior of pocket 26 permits wires from amplifier 26A located in pocket 26 to extend to the interior of garment 12. Wires 86 and 88 to speakers 14A, 16A, 18A and 20A may extend around the closable flaps of pockets 14, 16, 18 and 20, respectively, as illustrated in FIG. 3.

In accordance with the present invention, a mechanism is provided for removably supporting flexible wires on the garment of the subject invention, which wires are adapted to be removably connected between pockets for holding electrical signal producing devices and pockets for holding speakers to permit transmission of electrical signals from the electrical signal producing devices to speakers contained in the speaker pockets while permitting removal of the wires from the garment when the garment is to be cleaned. In the preferred embodiment illustrated in FIGS. 1 and 3, a flap 100 is provided which extends from pocket 22, which preferably houses tape player 22A, past pockets 18 and 14 through portion 30 of garment 12 which encircles a person's neck and past pockets 16, 20 and 24 on portion 34. Flap 100 may comprise an elongated piece of material which is permanently attached at one side adjacent zipper sections 40 and 42 and adjacent portion 30 which encircles the neck area (see FIG. 6). The non-permanently attached side of flap 100 is thereby foldable over wires located beneath flap 100 and may be fixed in place by fasteners 120 as illustrated in FIG. 7 or may be fixed in place by hook and loop fasteners 130 as shown in FIG. 8.

In this manner, flap 100 permits wires 80, 82, 84, 86 and 88 to extend between the various electrical components located within pockets 14, 16, 18, 22, 24 and 26 to thereby securely support those wires on garment 12, while also permitting those wires to be readily removed by opening of flap 100. With the removal of the wires, the garment 12 may be cleaned without any interference from the wires or from any of the electrical components located in the various pockets supported on garment 12. Flap 100 thus provides an unobtrusive mechanism for removably supporting the various wires on garment 12 required for operation of the personal sound system of the subject invention. Flap 100, accordingly, represents a substantial advance over sewing wires into garment 12 in the way taught in the aforementioned U.S. Pat. No. 4,589,134 patent to Waldron.

Figure 9:
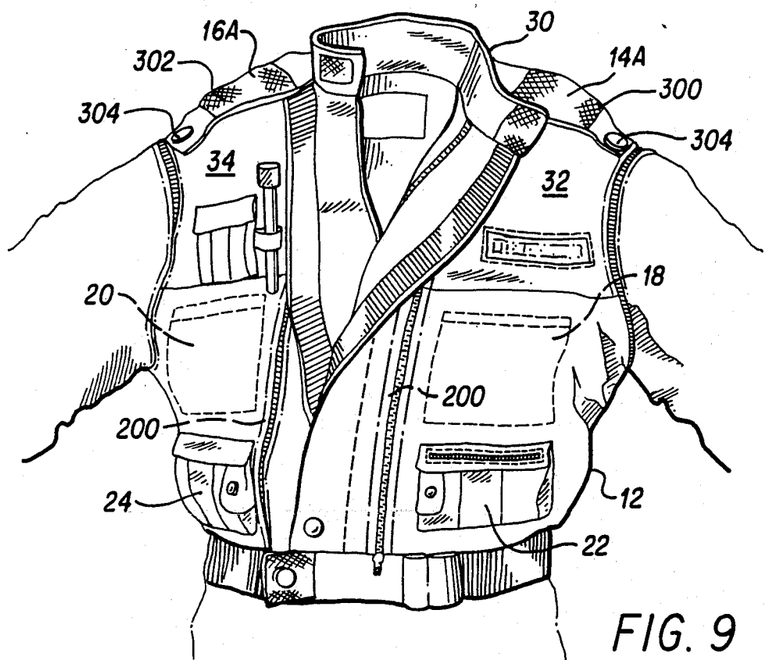
FIG. 9 is a front view of an alternative embodiment of the personal sound system illustrated in FIG. 1.

In an alternative embodiment illustrated in FIG. 9, the mechanism for removably supporting the flexible wires of the subject system comprises an elongated pocket 200 which extends from pocket 22, past pocket 18 on portion 32, around neck portion 30 and past pockets 20 and 22 on portion 34 of garment 12. Elongated pocket 200 is adopted to receive wires 80, 82, 84, 86 and 88 of FIG. 6 through various openings of pocket 200 to the interior of garment 12 adjacent the aforementioned pockets 18, 20, 22 and 24.

Figure 10:
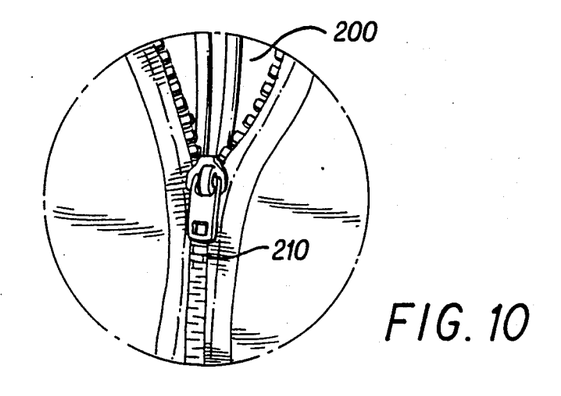
FIG. 10 illustrates a section of an elongated pocket in the garment shown in FIG. 9.

As further illustrated in FIG. 10, pocket 200 is closable through operation of zipper 210 to support wires 80, 82, 84, 86 and 88 and to permit those wires to be removed from pocket 200 when garment 12 is to be cleaned.

In the embodiment of FIG. 9, speakers 14A and 16A are mounted on epaulets 300 and 302, respectively. Speakers 14A and 16A may, in one embodiment, be actually sewn into epaulets 300 and 302 with epaulets 300 and 302 being removably supported on garment 12 by operation of fasteners 304. In the alternative, speakers 14A and 16A may be mounted within pockets located within epaulets 300 and 302, thereby permitting epaulets 300 and 302 to removably support speakers 14A and 16A, respectively.

A further feature of the subject invention comprises the utilization of a pocket 300 located on the back portion of garment 12 in the vicinity of a person's waist as illustrated in FIG. 2. Specifically, pocket 300 is located on portions 36 and 38 of garment 12 which depend rearwardly from the person's left and right shoulders, respectively, adjacent a person's waist. As illustrated in FIG. 2, pocket 300 is accessible from the exterior of garment 12 through opening 306 and opening 306 is closable through operation of a zipper 308 or other suitable closing device. Pocket 300 permits storage for accessories to the various electrical signal producing devices, such as storage of compact disks for compact disk player 22B, storage of tape cassettes for tape player 22A, or storage of additional batteries for power supply 24A.

External pocket 28 is located on the exterior of sleeve 50 of garment 12 as illustrated in FIG. 1. Pocket 28 may, for example, provide ready storage for accessories to the signal producing device utilized with garment 12 such as storage for one or more tape cassettes for tape player 22A.

Additional advantages and modifications will readily occur to those skilled in the art. The invention in its broader aspects is not, therefore, limited to the specific details and illustrative examples shown and described. Accordingly, departures may be made from such details without departing from the scope of applicant's general inventive concept.

I claim:

1. A personal sound system comprising:
  a. a garment adapted to substantially cover a person's upper torso, said garment having portions encircling a person's neck and depending forwardly and rearwardly from the person's right and left shoulders;
  b. first means for removably supporting a first speaker on said garment in the vicinity of one of the person's shoulders;
  c. second means for removably supporting a second speaker on said garment in the vicinity of the person's other shoulder;
  d. third means for removably supporting an electrical signal producing device on said garment, said third means is adjacent said second means; and
  e. fourth means for removably supporting flexible wires on said garment, which wires are adapted to removably connect between said third means and said first and second means to permit transmission of an electrical signal from said electrical signal producing device to said first and second speakers over said wires and to permit removal of said wires from said garment is to be cleaned, said fourth means comprising a flap extended from said third means to said second means and through that portion of said garment encircling the person's neck to said first means.

2. A system of claim 1 wherein said fourth means includes hook and loop fasteners for closing said flap over said wires.

3. A system of claim 1 wherein said fourth means includes snap fasteners for closing said flap over said wires.

4. A system of claim 3 wherein said flap opens to the interior of said garment.

5. A system of claim 1 wherein said flap opens to the interior of said garment.

6. A personal sound system comprising:
   a. a garment adapted to substantially cover a person's upper torso, said garment having portions encircling a person's neck and depending forwardly and rearedly from the person's right and left shoulders;
   b. first means for removably supporting a first speaker on said garment in the vicinity of one of the person's shoulders;
   c. second means for removably supporting a second speaker on said garment in the vicinity of the person's other shoulder;
   d. third means for removably supporting an electrical signal producing device on said garment, said third means is adjacent said second means; and
   e. fourth means for removably supporting flexible wires on said garment, which wires are adapted to removably connect between said third means and said first and second means to permit transmission of an electrical signal from said electrical signal producing device to said first and second speakers over said wires and to permit removal of said wires from said garment when said garment is to be cleaned, said fourth means comprises an elongated pocket extending from said third means to said second means and through that portion of said garment encircling the person's neck to said first means.

7. A system of claim 6 wherein said fourth means includes a zipper for selectively closing said elongated pocket.

8. A system of claim 7 wherein said elongated pocket opens to the exterior of said garment.

9. A personal sound system comprising:
   a. a garment adapted to substantially cover a person's upper torso, said garment having portions encircling a person's neck and depending forwardly and rearwardly from the person's right and left shoulders;
   b. first means for removably supporting a first speaker on said garment in the vicinity of one of the person's shoulders;
   c. second means for removably supporting a second speaker on said garment in the vicinity of the person's other shoulder;
   d. third means for removably supporting an electrical signal producing device on said garment, said third means comprising a pocket located below said second means, said pocket including a first closable opening sufficciently large to permit insertion of said electrical signal producing device and a second closable opening, orthogonally oriented with regard to said first opening and sufficiently large to permit access to controls of said electrical signal producing device while preventing removal of said device; and
   e. fourth means for removably supporting flexible wires on said garment, which wires are adapted to removably connect between said third means and said first and second means to permit transmission of an electrical signal from said electrical signal producing device to said first and second speakers over said wires and to permit removal of said wires from said garment when said garment is to be cleaned.

10. A system of any one of claims 1, 3, 4, 6–9 or 14 wherein said third means comprises a pocket located below said second means, said pocket including a first closable opening sufficiently large to permit insertion of said electrical signal producing device and a second closable opening, orthogonally oriented with regard to said first opening and sufficiently large to permit access to controls of said electrical signal producing device.

11. A system of any one of claims 1, 3, 4, 6–9 or 14 wherein said first and second means each comprise a separate closable pocket.

12. A system of any one of claims 1, 3, 4, 6–9 or 14 wherein said first and second means each comprise a separate epaulet.

13. A system of any one of claims 1, 3, 4, 6–9 or 14 further including a closable pocket located on that portion of said garment depending rearwardly from the person's right and left shoulders adjacent the person's waist and accessible from the exterior of said garment to permit storage of accessories for said electrical signal producing device.

* * * * *